United States Patent
Gershon et al.

(10) Patent No.: US 9,876,130 B1
(45) Date of Patent: Jan. 23, 2018

(54) METHOD FOR FORMING SILVER-COPPER MIXED KESTERITE SEMICONDUCTOR FILM

(71) Applicant: International Business Machines Corporation, Armonk, NY (US)

(72) Inventors: Talia S. Gershon, White Plains, NY (US); Oki Gunawan, Westwood, NJ (US); Yun S. Lee, White Plains, NY (US); Ravin Mankad, Yonkers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/336,427

(22) Filed: Oct. 27, 2016

(51) Int. Cl.
| | |
|---|---|
| *H01L 31/032* | (2006.01) |
| *H01L 31/0224* | (2006.01) |
| *H01L 31/0216* | (2014.01) |
| *H01L 31/18* | (2006.01) |
| *H01L 31/072* | (2012.01) |

(52) U.S. Cl.
CPC .... *H01L 31/0326* (2013.01); *H01L 31/02168* (2013.01); *H01L 31/022441* (2013.01); *H01L 31/072* (2013.01); *H01L 31/18* (2013.01)

(58) Field of Classification Search
CPC .............. Y02E 10/541; H01L 31/0326; H01L 31/0749; H01L 31/03923
See application file for complete search history.

(56) References Cited

U.S. PATENT DOCUMENTS

| | | | | |
|---|---|---|---|---|
| 9,368,660 | B2* | 6/2016 | Bag ...................... | H01L 31/0326 |
| 2012/0168910 | A1* | 7/2012 | Jackrel .................. | H01L 21/268 |
| | | | | 257/613 |
| 2012/0313200 | A1* | 12/2012 | Jackrel ................ | H01L 31/0322 |
| | | | | 257/431 |
| 2013/0164917 | A1* | 6/2013 | Liang .................. | H01L 31/0322 |
| | | | | 438/478 |
| 2013/0316519 | A1* | 11/2013 | Mitzi ................ | H01L 21/02422 |
| | | | | 438/478 |
| 2016/0064581 | A1* | 3/2016 | Urien ................ | H01L 31/02242 |
| | | | | 136/256 |

OTHER PUBLICATIONS

Gershon, T., et al., "Photovoltaic Materials and Devices Based on the Alloyed Kesterite Absorber (AgxCu 1-x ) 2 ZnSnSe 4", Adv. Energy Mater., Mar. 7, 2016, 7 pages, 6.

* cited by examiner

*Primary Examiner* — Bradley K Smith
*Assistant Examiner* — David Goodwin
(74) *Attorney, Agent, or Firm* — Scully, Scott, Murphy & Presser, P.C.; Louis J. Percello, Esq.

(57) ABSTRACT

After forming a layer of a Cu-deficient kesterite compound having the formula $Cu_{2-x}Zn_{1+x}Sn(S_y Se_{1-y})_4$, wherein $0 < x < 1$, and $0 \leq y \leq 1$, on a substrate and forming a Ag layer on the Cu-deficient kesterite compound layer, the Cu-deficient kesterite compound layer and Ag layer are annealed in a S- and/or Se-rich ambient to provide a film containing a Ag—Cu mixed kesterite compound having the formula $Ag_x Cu_{2-x} ZnSn(S_y Se_{1-y})_4$, wherein $0 < x < 2$, and $0 \leq y \leq 1$.

20 Claims, 4 Drawing Sheets

METHOD FOR FORMING SILVER-COPPER MIXED KESTERITE SEMICONDUCTOR FILM

STATEMENT OF GOVERNMENT RIGHTS

This invention was made with Government support under Contract No.: DE-EE-0006334 awarded by Department of Energy. The Government has certain rights in this invention.

BACKGROUND

The present application relates to kesterite-type semiconductor materials, and more particularly to a method of forming a film containing a Ag—Cu mixed kesterite compound for photovoltaic devices.

Kesterite-type semiconductors, $Cu_2ZnSn(S,Se)_4$ (CZTSSe), are promising semiconducting absorber materials for the next generation of thin film photovoltaic devices due to their suitable optical bandgaps that match well to the solar spectrum, high absorption coefficients, and earth-abundant elemental constituents. While photovoltaic devices fabricated from solution-grown CZTSSe have achieved a peak efficiency of 12.6%, further improvements have been stymied by an inability to increase the open circuit voltage, $V_{oc}$, via processing optimization. Studies show that the open circuit voltage in CZTSSe-based photovoltaic devices is limited by absorber band tailing caused by high density of Cu/Zn antisites due to the similar ionic radii of Cu and Zn.

Substitution of Cu with an alternative element, Ag, is desirable since, in addition to belonging to the same chemical group as Cu, Ag possesses an atomic radius roughly 16% larger than that of Cu. The large dissimilarity in atomic radius is expected to suppress the Cu/Zn antisite defect formation. A method of forming a film containing a Ag—Cu mixed kesterite compound is thus needed.

SUMMARY

The present application provides a method of forming a film containing a Ag—Cu mixed kesterite compound having the formula $Ag_xCu_{2-x}ZnSn(S_ySe_{1-y})_4$, wherein $0<x<2$, and $0\le y\le 1$. The film can be provided by first forming a layer of a Cu-deficient kesterite compound having the formula $Cu_{2-x}Zn_{1+x}Sn(S_ySe_{1-y})_4$, wherein $0<x<1$, and $0\le y\le 1$, on a substrate. A Ag layer is then formed on the Cu-deficient kesterite compound layer, and thereafter the Cu-deficient kesterite compound layer and Ag layer are annealed in a S- and/or Se-rich ambient.

In one aspect of the present application, a method of forming a film including a Ag—Cu mixed kesterite compound having the formula $Ag_xCu_{2-x}ZnSn(S_ySe_{1-y})_4$, wherein $0<x<2$, and $0\le y\le 1$, is provided. The method includes first forming a layer including a Cu-deficient kesterite compound on a substrate. The Cu-deficient kesterite compound is represented by the formula $Cu_{2-x}Zn_{1+x}Sn(S_ySe_{1-y})_4$, wherein $0<x<1$, and $0\le y\le 1$. A Ag layer is then formed on the Cu-deficient kesterite compound layer. Next, the Cu-deficient kesterite compound layer and the Ag layer are annealed.

In another aspect of the present application, a method of forming a photovoltaic device is provided. The method includes forming a back contact layer on a substrate. An absorber layer is then formed on the back contact layer. The absorber layer includes a Ag—Cu mixed kesterite compound having the formula $Ag_xCu_{2-x}ZnSn(S_ySe_{1-y})_4$, wherein $0<x<2$, and $0\le y\le 1$. After forming a buffer layer on the absorber layer, a transparent front contact layer is formed on the buffer layer.

DETAILED DESCRIPTION

Figure 1:
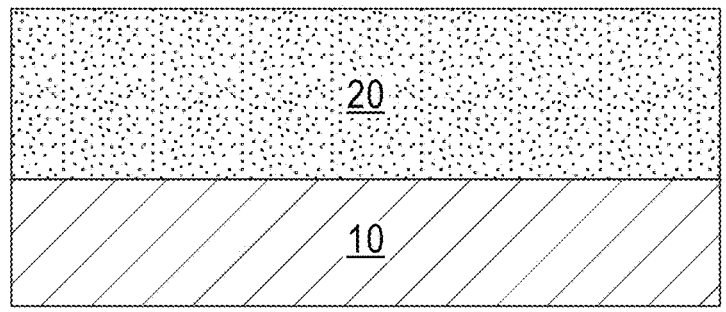
FIG. 1 is a cross-sectional view of a starting structure including a substrate and a Cu-deficient kesterite compound layer formed on the substrate according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

FIG. 1 illustrates a cross-sectional view of a starting structure for fabricating a film of a Ag—Cu mixed kesterite compound having the formula $Ag_xCu_{2-x}ZnSn(S_ySe_{1-y})_4$, wherein $0<x<2$, and $0\le y\le 1$ (hereinafter referred to as the ACZTSSe layer) according to an embodiment of the present application. As shown, the starting structure includes a substrate 10 and a layer of a Cu-deficient kesterite compound having the formula $Cu_{2-x}Zn_{1+x}Sn(S_ySe_{1-y})_4$, wherein $0<x<1$, and $0\le y\le 1$ (hereinafter referred to as the Cu-deficient CZTSSe layer 20) formed on the substrate 10.

The substrate 10 may include a metal foil substrate, a glass substrate, a ceramic substrate, a polymer substrate or any combination thereof. If the substrate 10 itself is not inherently electrically conductive, the substrate 10 can be coated with a conductive material layer. For example, the substrate 10 may be coated with molybdenum (Mo). The thickness of the substrate 10 can be from 10 μm to 5 mm, although lesser and greater thicknesses can also be employed.

The Cu-deficient CZTSSe layer 20 can be formed by depositing its constituent elements (i.e., Cu, Zn, Sn, S and Se). Any suitable vapor phase deposition process or solution phase deposition process known in the art may be used, including, but not limited to, physical vapor deposition (PVD), chemical vapor deposition (CVD), co-evaporation, spin coating, dip coating and screen printing. In one embodiment, the Cu-deficient CZTSSe layer 20 may be formed by co-evaporation of Cu, Zn, Sn, and at least one of S and Se from elemental sources containing these metals in elemental form or from alloy sources containing binary or ternary alloy of theses metals, as a single layer or as a multilayer stack, followed by annealing the deposited layer(s) under a S- and/or Se-rich ambient. The deposition temperature can be from 20° C. to 500° C. The Cu deficiency may be controlled by managing the deposition conditions. The thickness of the Cu-deficient kesterite layer 20 can be from 1 μm to 2 μm, although lesser and greater thickness can also be employed.

Figure 2:
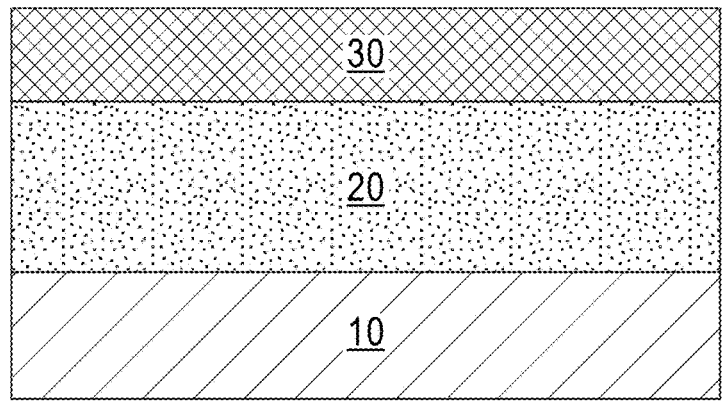
FIG. 2 is a cross-sectional view of the structure of FIG. 1 after forming a Ag layer on the Cu-deficient kesterite compound layer.

Referring to FIG. 2, a Ag layer 30 is formed on the Cu-deficient CZTSSe layer 20. The Ag layer 30 may be deposited, for example, by CVD, PVD, plasma enhanced chemical vapor deposition (PECVD) or atomic layer deposition (ALD). The thickness of Ag layer 30 is determined by the degree of Cu-deficiency in the underlying Cu-deficient CZTSSe layer 20. Typically a higher degree of Cu-deficiency in the Cu-deficient CZTSSe layer 20 requires a thicker Ag layer 30, and vice versa. In one embodiment, the thickness of the Ag layer 30 can be from 10 nm to 200 nm.

Figure 3:
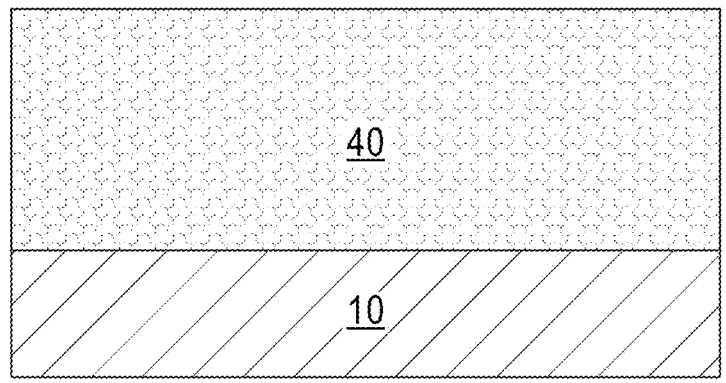
FIG. 3 is a cross-sectional view of the structure of FIG. 2 after forming a film of a Ag—Cu mixed kesterite compound having the formula $Ag_xCu_{2-x}ZnSnSe_4$.

Referring to FIG. 3, the whole stack of FIG. 2 (i.e., the Ag layer 30 and the Cu-deficient CZTSSe layer) is annealed under a S- and/or Se-rich ambient to form a ACZTSSe layer 40 on the substrate 10. The annealing can be carried out at a temperature ranging from 400° C. to 600° C. for 2 min to 10 min. In one embodiment, a rapid thermal anneal (RTA) is performed. During annealing, Ag diffuses into the Cu-deficient CZTSSe layer 20 and reacts with the Cu-deficient kesterite compound to form a fully alloyed $Ag_xCu_{2-x}ZnSn(S_ySe_{1-y})_4$ compound, wherein $0<x\leq1$, and $0\leq y\leq1$. The thickness of the ACZTSSe layer 40 can be from 300 nm to 3000 nm. The Ag layer 30 is no longer present once the ACZTSSe layer 40 is formed.

Figure 4A:
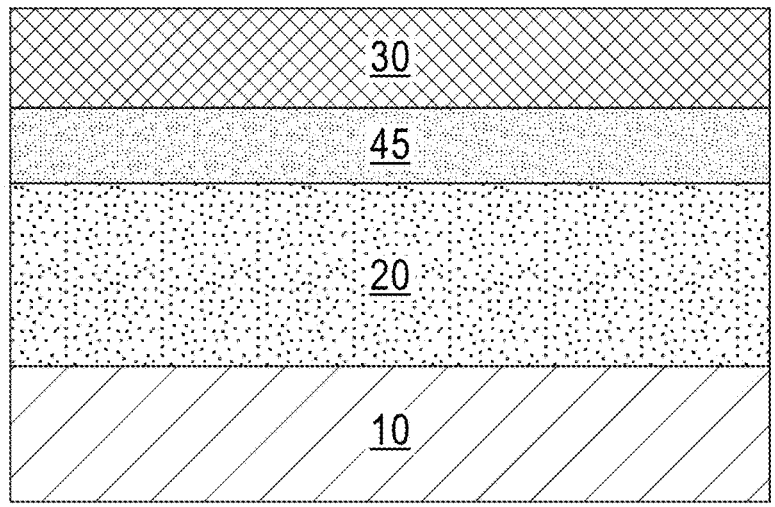
FIG. 4A is a cross-sectional view of the structure of FIG. 2 after forming a capping layer between the Cu-deficient kesterite compound layer and the Ag layer.
Figure 4B:
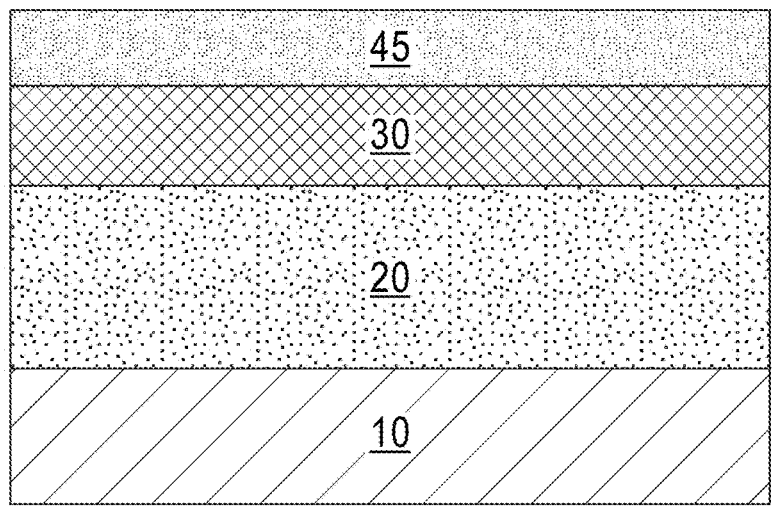
FIG. 4B is a cross-sectional view of the structure of FIG. 2 after forming a capping layer on the Ag layer.

The S- and/or Se-rich ambient can be created by supplying a S- and/or Se-containing gas such as, for example, $H_2Se$, $H_2S$, elemental Se or elemental S into the annealing chamber. Alternatively, the S- and/or Se-rich ambient can be created by placing a capping layer 45 including at least one of S and Se either between the Cu-deficient CZTSSe layer 20 and the Ag layer 30 (as shown in FIG. 4A) or on top of the Ag layer 30 (as shown FIG. 4B). The capping layer 45 may include at least one of SnS, SnSe, $SnS_2$ and $SnSe_2$. The capping layer 45 evaporates during the annealing process, thus maintaining sufficient vapor pressure to compensate for the typically observed S and/or Se evaporation loss during the high-temperature annealing process. The capping layer 45 is no longer present once the ACZTSSe layer 40 is formed. It should be understood that the S- and/or Se-rich ambient can be created by one or more of the processes described above.

The properties of sample compounds, $Ag_xCu_{2-x}ZnSnSe_4$ when y=0, with different Ag/(Ag+Cu) ratios are investigated.

Figure 5A:
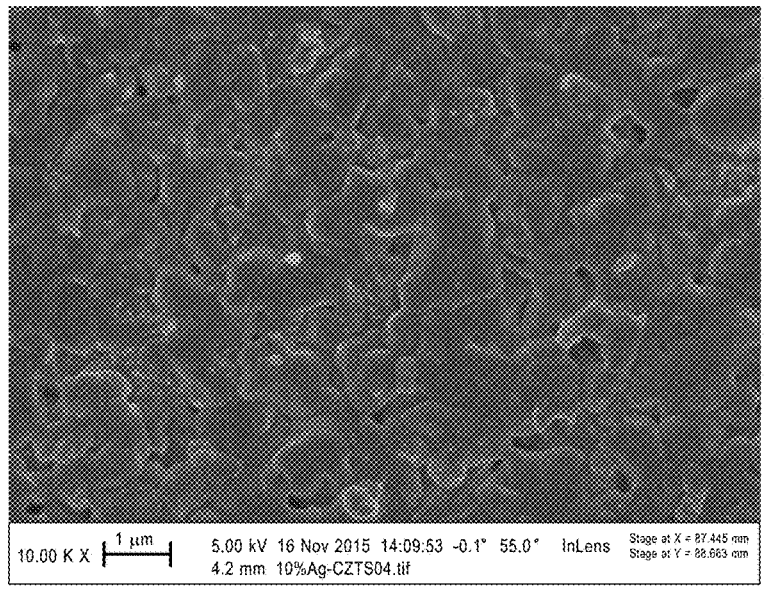
FIGS. 5A-5B are various views top down and cross sectional, respectively, of a scanning electron microscope (SEM) image of a $Ag_xCu_{2-x}ZnSnSe_4$ film with a Ag/(Ag+Cu) ratio of about 10%.
Figure 5B:
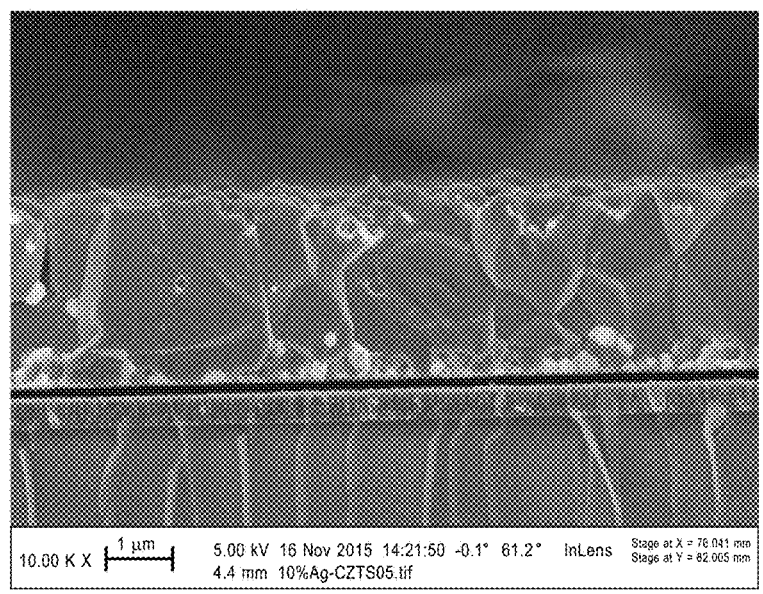

FIG. 5A shows a top-view and FIG. 5B shows a cross-sectional view of a scanning electron microscope (SEM) image of a $Ag_xCu_{2-x}ZnSnSe_4$ film with Ag/(Ag+Cu) ratio of about 10% that was prepared using the processing steps of the present application described in FIGS. 1-3. The SEM images show that the $Ag_xCu_{2-x}ZnSnSe_4$ film is relatively flat and pin-hole free, and has a dense microstructure with grain size over 1 μm. This indicates that the process disclosed in the present applicant allows forming a high quality $Ag_xCu_{2-x}ZnSnSe_4$ film with larger grain size, which is crucial for high performance photovoltaic devices.

Figure 6:
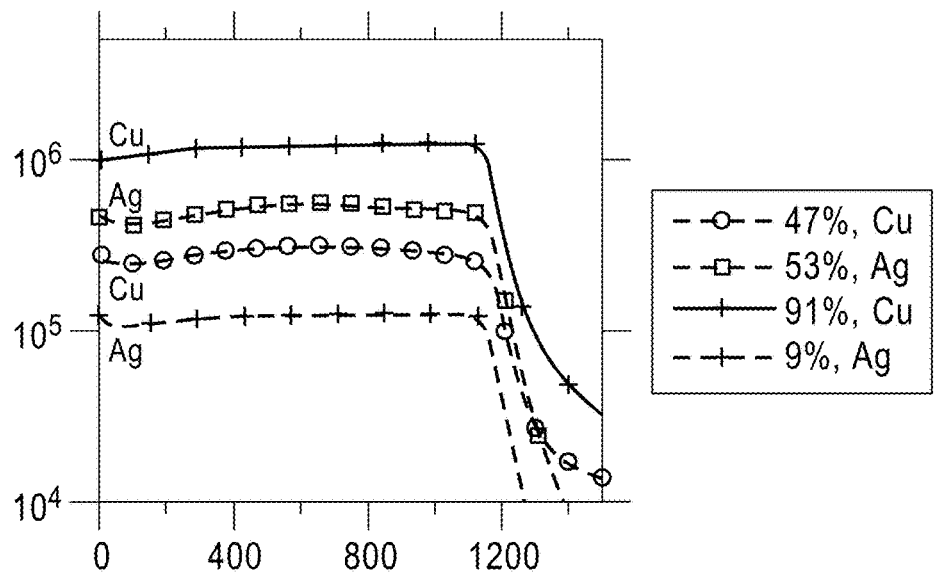
FIG. 6 shows secondary ion mass spectrometry (SIMS) depth profiles of $Ag_xCu_{2-x}ZnSnSe_4$ films with different Ag/(Ag+Cu) ratios.

FIG. 6 shows secondary ion mass spectrometry (SIMS) depth profiles of $Ag_xCu_{2-x}ZnSnSe_4$ films with different Ag/(Ag+Cu) ratios. The SIMS depth profiles indicate that the Cu and Ag concentrations are uniform through the films with varying Ag contents.

Photophysical properties including ultraviolet (UV) absorption and photoluminescence (PL) emission of $Ag_xCu_{2-x}ZnSnSe_4$ films with different Ag/(Ag+Cu) ratios were measured at room temperature. The bandgaps and PL peaks of these $Ag_xCu_{2-x}ZnSnSe_4$ films are summarized in Table 1.

TABLE 1

| Photophysical Properties of $Ag_xCu_{2-x}ZnSnSe_4$ Films | | | | | |
|---|---|---|---|---|---|
| Ag/(Ag + Cu) | 0% | 9% | 22% | 53% | 100% |
| Bandgap (eV) | 1.0 | 1.0 | 1.1 | 1.2 | 1.3 |
| PL (eV) | 0.9 | 0.9 | 1.1 | 1.2 | 1.3 |

As shown in Table 1, the bandgaps of the $Ag_xCu_{2-x}ZnSnSe_4$ materials can be tailored by varying Ag content. The bandgap of the $Ag_xCu_{2-x}ZnSnSe_4$ film increases when the Ag content increases, from 1.0 eV at Ag/(Ag+Cu)=0% (i.e. pure-Cu $Cu_2ZnSnSe_4$) to 1.3 eV at Ag/(Ag+Cu)=100% (i.e. pure-Ag $Ag_2ZnSnSe_4$). Similarly, the PL peak position also increases when the Ag content increases, from 0.9 eV at Ag/(Ag+Cu)=0% to 1.3 eV at Ag/(Ag+Cu)=100%. It can be seen that the energy difference between the bandgap and the PL peak position decreases with increasing Ag contents and approaches to zero when Ag/(Ag+Cu) ratio is greater than 22%. Since the difference between the bandgap and PL peak position can be correlated with the extent of band tailing, the band-tailing problem, which is a primary cause of $V_{oc}$ loss in CZTSSe-based photovoltaic devices, is suppressed by substituting Cu with Ag.

Once the formation of the ACZTSSe layer 40 is complete, any additional processing steps may be performed to form a complete photovoltaic device. It is to be understood, however, that the present application is more broadly applicable to any application involving Ag—Cu mixed kesterite compounds. Also, although in the present application the ACZTSSe film is illustrated and described as an absorber layer of a photovoltaic device, the ACZTSSe film can be used as a buffer layer of a photovoltaic device as well.

Figure 7:
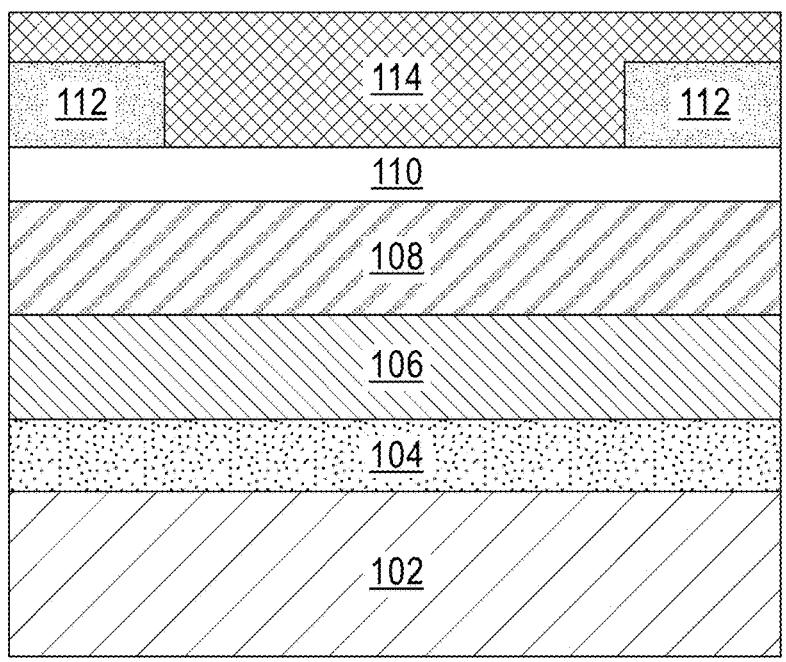
FIG. 7 is a cross-sectional view of a photovoltaic device employing a layer of a Ag—Cu mixed kesterite compound as an absorber layer.

Referring to FIG. 7, a photovoltaic device including, for bottom to top, a substrate 102, a back contact layer 104, a ACZTSSe absorber layer 106 prepared by the techniques of the present application, a buffer layer 108 and a transparent front contact layer 110 is provided.

The substrate 102 can be a metal foil substrate, a glass substrate, a ceramic substrate or a polymer substrate described above in FIG. 1. In one embodiment, the substrate 102 is a Mo-coated glass substrate.

Depending on the material of the substrate 102, and in some embodiments of the present application, the sur4face of the substrate 102 is coated with a layer of a contact material (referred to as a back contact layer 104), to promote electrical contact between the substrate 102 and the ACZTSSe absorber layer 106. The back contact layer 104 can include an electrically conductive metal such as, for example, Mo, Cu, Al, Ni, Nb, W, Cr or alloy thereof. The back contact layer 104 can be formed by any conventional deposition techniques including PVD, CVD, atomic layer deposition (ALD), plating, printing and spin coating. The thickness of the back contact layer 104 can be from 300 nm to 2.0 µm, although lesser and greater thicknesses can also be employed.

The ACZTSSe absorber layer 106 is formed on top of the substrate 102, or the back contact layer 104, if present, using the processing steps described above in FIGS. 1-4B.

The buffer layer 108 is formed on top of the ACZTSSe absorber layer 106. The buffer 108 may include at least one of cadmium sulfide (CdS), a cadmium-zinc-sulfur material having the formula of $Cd_{1-x}Zn_xS$ (wherein $0<x\leq1$), indium sulfide ($In_2S_3$), zinc oxide (ZnO), zinc oxysulfide (ZnOS) and aluminum oxide ($Al_2O_3$). The buffer layer 108 may be formed using a conventional deposition process such as evaporation or spin coating. The thickness of the buffer layer 108 can be from 5 nm to 100 nm, although lesser and greater thicknesses can also be employed. The buffer layer 108 and the ACZTSSe absorber layer 106 form a p-n junction therebetween.

The transparent front contact layer 110 is formed on top of the buffer layer 108. The transparent front contact layer 110 can include a transparent conductive oxide such as, for example, indium tin oxide (ITO), aluminum doped zinc oxide (AZO), fluorine doped tin oxide (FTO) or boron doped zinc oxide (BZO). The transparent front contact layer 110 can be deposited by PVD or CVD. The thickness of the transparent front contact layer 110 can be from 100 nm to 300 nm, although lesser and greater thicknesses can also be employed.

In some embodiments of the present application, metal contacts 112 may optionally be formed on top of the transparent front contact layer 110 to further enhance the conductive properties of the transparent front contact layer 110. The metal contacts 112 may include Ni, Al, Ag, Au, Mo, or any other suitable metal or alloy. The metal contacts 112 may be deposited on the transparent front contact layer 112, for example, by electron-beam evaporation. The sizes of the metal contacts 112 are optimized to minimize shadow loss and receiving loss.

An antireflective coating layer 114 may optionally be formed on top of the transparent front contact layer 110. The antireflective coating layer 114 covers the metal contacts 112, if present. The antireflective coating layer may include magnesium oxide (MgO) or magnesium fluoride ($MgF_2$). The antireflective coating layer 14 may be deposited on the transparent front contact layer 110 and the metal contacts 112, if present, for example, by electron-beam evaporation.

Performance of a photovoltaic device using a sample compound, $Ag_xCu_{2-x}ZnSnSe_4$ with Ag/(Ag+Cu)=9% (i.e., x=0.18) as the absorber layer and a control device using $Cu_2ZnSnSe_4$ as the absorber layer were investigated and the results are summarized in Table 2. It can be seen that introducing about 10% Ag into $Cu_2ZnSnSe_4$ can improve the conversion efficiency by up to 1%. In addition, introducing about 10% Ag into $Cu_2ZnSnSe_4$ also results in an increase in $V_{oc}$ (from 369 mV for $Cu_2ZnSnSe_4$ to 406 mV for $Ag_xCu_{2-x}ZnSnSe_4$ with x=0.18). Thus, Ag-alloying can effectively suppress formation of Cu/Zn antisite defects in CZTSSe-based photovoltaic devices.

TABLE 2

Performance of Photovoltaic Devices Based On $Ag_xCu_{2-x}ZnSnSe_4$ Absorber Materials With Varying Ag Contents

| Ag | Efficiency (%) | Fill Factor (%) | $V_{oc}$ (mV) | Jsc (mA/cm$^2$) |
|---|---|---|---|---|
| $Cu_2ZnSnSe_4$ | 9.0 ± 0.2 | 65.0 ± 2 | 369 ± 8 | 37.5 ± 1.0 |
| $Ag_{0.18}Cu_{1.82}ZnSnSe_4$ | 9.7 ± 0.2 | 60.0 ± 1.7 | 406 ± 2 | 39.9 ± 1.0 |

While the application has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the application is intended to encompass all such alternatives, modifications and variations which fall within the scope and spirit of the application and the following claims.

What is claimed is:

1. A method of forming a film comprising a Ag—Cu mixed kesterite compound having the formula $Ag_xCu_{2-x}ZnSn(S_ySe_{1-y})_4$, wherein $0<x<2$, and $0\leq y\leq1$, the method comprising:
    forming a layer consisting of a Cu-deficient kesterite compound on a substrate, the Cu-deficient kesterite compound having the formula $Cu_{2-x}Zn_{1+x}Sn(S_ySe_{1-y})_4$, wherein $0<x<1$, and $0\leq y\leq1$;
    forming a Ag layer consisting of elemental Ag on the layer consisting of the Cu-deficient kesterite compound; and
    annealing the layer consisting of the Cu-deficient kesterite compound and the Ag layer.

2. The method of claim 1, wherein the annealing is performed at a temperature ranging from 400° C. to 600° C.

3. The method of claim 1, wherein the annealing is performed from 2 minutes to 10 minutes.

4. The method of claim 1, wherein the annealing is performed using rapid thermal annealing.

5. The method of claim 1, wherein the annealing is performed in a S-rich and/or Se-rich atmosphere.

6. The method of claim 5, wherein the S- and/or Se-rich atmosphere is provided by supplying a S- and/or Se-containing gas into an annealing chamber where the annealing is performed.

7. The method of claim 6, wherein the S- and/or Se-containing gas comprises $H_2Se$, $H_2S$, elemental Se or elemental S.

8. The method of claim 5, wherein the S- and/or Se-rich atmosphere is provided by forming a capping layer comprising at least one of S and Se.

9. The method of claim 8, wherein the capping layer is formed between the Cu-deficient kesterite compound and the Ag layer.

10. The method of claim 8, wherein the capping layer is formed on the Ag layer before the annealing.

11. The method of claim 8, wherein the capping layer comprises SnS, SnSe, $SnS_2$, $SnSe_2$ or combinations thereof.

12. A method of forming a photovoltaic device comprising
    forming a back contact layer on a substrate;
    forming an absorber layer on the back contact layer, the absorber layer comprising a Ag—Cu mixed kesterite compound having the formula $Ag_xCu_{2-x}ZnSn(S_y, Se_{1-y})_4$, wherein $0<x<2$, and $0 \le y \le 1$, wherein the forming the absorber layer comprises:

forming a layer consisting of a Cu-deficient kesterite compound on the substrate, the Cu-deficient kesterite compound having the formula $Cu_{2-x}Zn_{1+x}Sn(S_y, Se_{1-y})_4$, wherein $0<x<1$, and $0 \le y \le 1$, forming a Ag layer consisting of elemental Ag on the layer consisting of the Cu-deficient kesterite compound, and annealing the layer consisting of the Cu-deficient kesterite compound and the Ag layer;

forming a buffer layer on the absorber layer; and forming a transparent front contact layer on the buffer layer.

13. The method of claim 12, wherein the annealing is performed in an S-rich and/or Se-rich atmosphere.

14. The method of claim 13, wherein the S- and/or Se-rich atmosphere is provided by supplying a S- and/or Se-containing gas into an annealing chamber where the annealing is performed.

15. The method of claim 12, wherein the S- and/or Se-rich atmosphere is provided by forming a capping layer comprising at least one of S and Se.

16. The method of claim 15, wherein the capping layer is formed between the Cu-deficient kesterite compound and the Ag layer.

17. The method of claim 15, wherein the capping layer is formed on the Ag layer before the annealing.

18. The method of claim 12, further comprising forming metal contacts on the transparent front contact layer.

19. The method of claim 18, further comprising forming an antireflective coating layer on the transparent contact layer.

20. The method of claim 1, wherein the Ag layer is no longer present once the film comprising the Ag—Cu mixed kesterite compound is formed.

* * * * *